April 14, 1959 C. H. ZIERDT, JR 2,882,462

SEMICONDUCTOR DEVICE

Filed June 29, 1954

INVENTOR:
CONRAD H. ZIERDT JR.,

BY Julius J. Zaskalicky

HIS ATTORNEY.

United States Patent Office 2,882,462

Patented Apr. 14, 1959

2,882,462

SEMICONDUCTOR DEVICE

Conrad H. Zierdt, Jr., Syracuse, N.Y., assignor to General Electric Company, a corporation of New York Application June 29, 1954, Serial No. 440,092

15 Claims. (Cl. 317—235)

This invention relates generally to semiconductor devices, and more particularly, to a structure for mounting and enclosing a semiconductor device.

Semiconductor devices are well known in the art and have been used in place of vacuum tubes in performing certain functions such as amplification. In the past, these devices have been produced only to a limited extent and have not been reliable. This situation arose because of the difficulties involved in manufacturing a semiconductor device which is sealed to the atmosphere and which is readily adapted to mass production and assembly without the use of skilled mechanics.

Accordingly, a principal object of the present invention is to provide an enclosure for a semiconductor device which is readily adapted to mass production at low cost and does not require close manufacturing tolerances.

A further object of the present invention is to provide a hermetically sealed housing for a semiconductor device.

Still another object of the present invention is to provide a semiconductor device having reproducible characteristics.

A further object of the present invention is to provide a reliable semiconductor device whose properties do not change with time.

A principal feature of the present invention is an enclosure containing a wafer-supporting member. A semiconductor wafer is mounted in the wafer-supporting member and is in contact with a pair of pre-positioned contact members which are mounted within the enclosure. Means are provided for making an electrical connection to the wafer-supporting member to provide a base lead for the semiconductor device. Means are further provided for making electrical connections through said enclosure to said prepositioned members to provide emitter and collector leads for the device.

The features of this invention which are believed to be novel are set forth with particularity in the appended claims. The invention itself, however, both as to its organization and methods of operations, together with further objects and advantages thereof, may best be understood by reference to the following description when taken in connection with the accompanying drawing in which:

Figure 1:
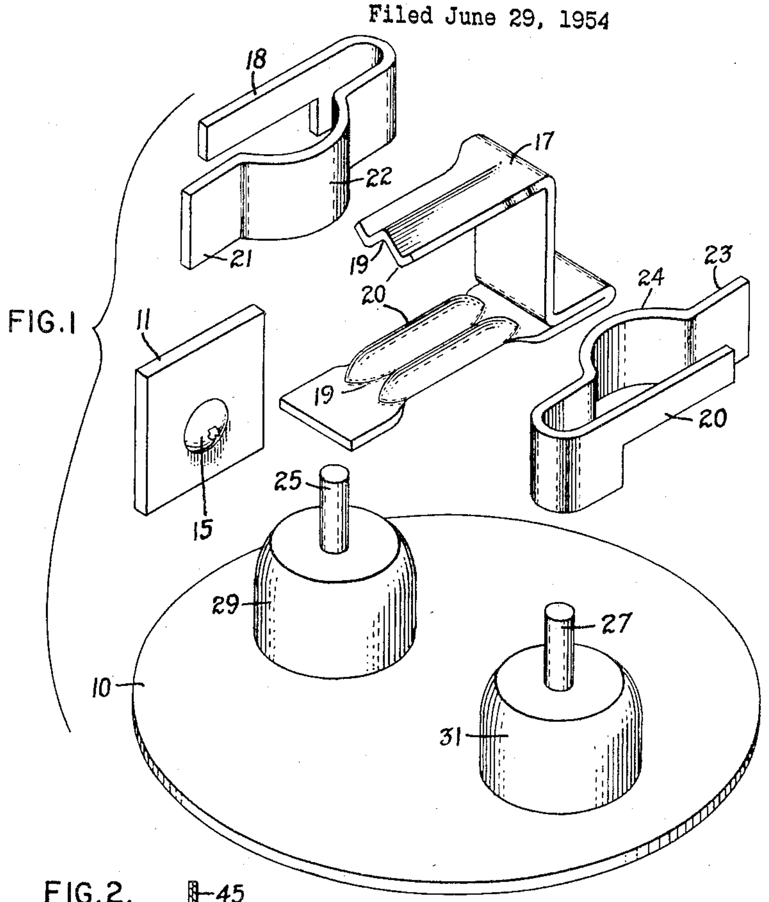
Fig. 1 is an exploded perspective view of a semiconductor device embodying the present invention.

Referring now to Fig. 1, an illustrative embodiment of the present invention is therein shown comprising a conductive base disk 10 and a cap 12 (Fig. 2) which provide an enclosure for a germanium wafer 11. The germanium wafer 11 has indium dots 13 and 15 (Fig. 2) fused into opposite faces thereof to form a P–N junction device therewith. A mounting structure is provided for making electrical contact with each of the dots 13 and 15 and the wafer 11. The mounting structure comprises a wafer-supporting member 17 which is adapted to receive the wafer 11. Two pre-positioned contacts 21 and 23 are mounted on the base disk 10 to provide electrical connections to the dots 13 and 15.

To facilitate mass production of a semiconductor device, it is essential that the assembly thereof be possible without skilled mechanics and not be held to close tolerances. Therefore, the wafer-supporting member 17 is constructed so that the wafer 11 can readily be positioned therein. As shown in Fig. 1, the wafer-supporting member 17 is U-shaped and has longitudinal V-shaped grooves 19 in the legs thereof. The ends 18 and 20 of the V-shaped grooves remote from the base of the member are curved. This curvature automatically directs the wafer 11 into the grooves, even if the wafer 11 is not exactly centered on the grooves, thereby obviating any close tolerance requirement.

During assembly, the contact members 21 and 23 are positioned on the base disk 10 before the wafer-carrying member is positioned therebetween. In accordance with the present invention the contact members 21 and 23 are shaped to receive the wafer 11 and to make contact with the dots 13 and 15 without requiring an exact alignment of the wafer 11 therebetween. As illustrated, the contact members are U-shaped springs and have projecting members 22 and 24, respectively, extending toward each other. The legs of the U-shaped springs nearest the other thus form a tapered space which guides the wafer into position if it is not exactly on center during the assembly procedure.

Figures 2, 3, 4, 5:
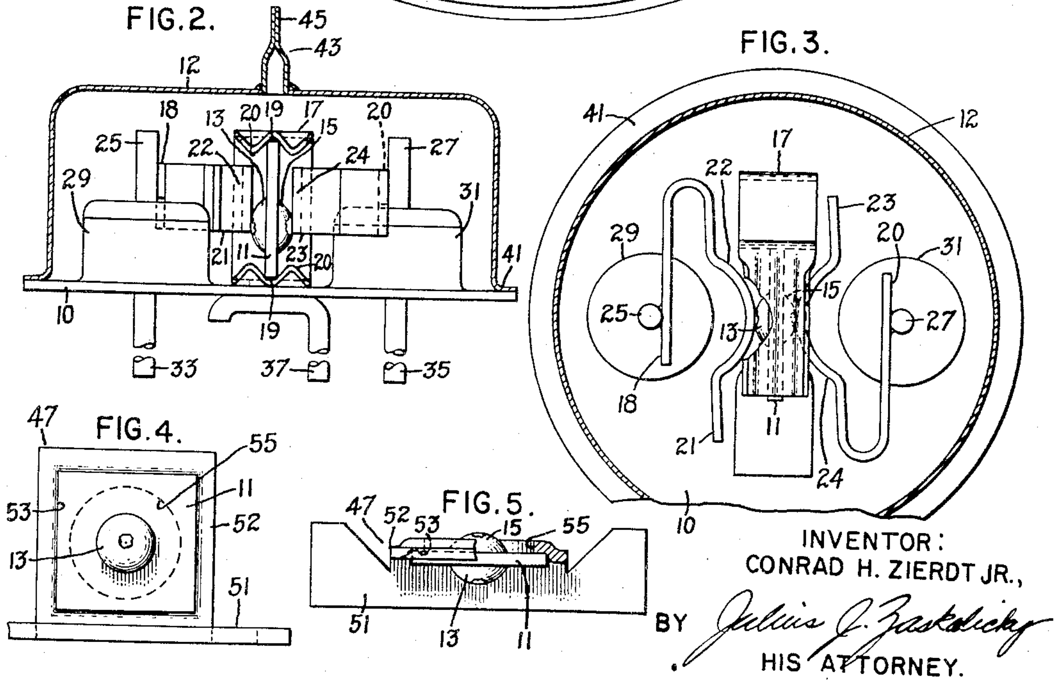
Fig. 2 is a front view of the device illustrated in Fig. 1.
Fig. 3 is a plan view, partly in section, of the device illustrated in Fig. 1.
Fig. 4 is a plan view showing a modification of a member of the device illustrated in Fig. 1.
Fig. 5 is a front view of the member shown in Fig. 4.

As shown in Fig. 3, mounting posts 25 and 27 are fixedly attached to the base disk 10 and are insulated therefrom by means here shown as glass beads 29 and 31. The legs 18 and 20 of connecting springs 21 and 23 are fixedly attached to the posts 25 and 27, respectively. The rounded projections 22 and 24 contact the dots 13 and 15 respectively. This contact may be either a mechanical contact made by the force of the springs pushing inwardly on the dots, or may be made through the use of solder or mercury amalgam. The wafer-carrying member 17 is positioned between the mounting posts 25 and 27 so that the springs 22 and 24 contact the dots 13 and 15 as mentioned above.

The member 17 is constructed of a conducting material and is, conductively as well as mechanically, attached to the base disk 10. Each of the springs 22 and 24 is constructed of a conductive material as are the mounting posts 25 and 27. Means here shown as conductors 33 and 35 extend through the base disk 10 and into electrical contact with the mounting posts 25 and 27 respectively, thereby providing electrical contact through the posts and the springs to the opposed dots 13 and 15. Thus, the conductors 33 and 35 serve as the emitter and collector leads of the semiconductor device. The apertures through which the conductors 33 and 35 extend through the base disk 10 are hermetically sealed.

Means, here shown as conductor 37, is provided for making electrical contact to the base disk 10. Since the base disk 10 is in electrical contact with the member 17 and since the member 17 is of conductive material and is in contact with the base wafer 11, the conductor 37 provides a base lead for the semiconductor device.

The cap 12 provides an enclosure for the mounting structure of the semiconductor wafer 11 as mentioned above. The cap 12 is rim-welded to the base disk 10 as indicated at 41 and an exhaust tube 43 is provided at the top of the cap 12 so that air and other foreign gases can be readily removed from the enclosure.

During assembly, after the mounting structures are attached as hereinabove indicated, the cap 12 is attached to the base disk 10 and is welded thereto. The air is then removed through the exhaust tube 43, and the exhaust tube is then sealed as indicated at 45.

Figs. 4 and 5 illustrate another embodiment of the present invention. In this embodiment, a wafer-supporting member designated generally as 47 comprises a base portion 51. An upright portion 52 is formed integrally with the base portion 51 and has a recess 53 therein with an aperture 55 in the center of the recess 53. The recess 53 conforms to the shape of the wafer 11 and retains the wafer 11 therein when the wafer is pressed into the recess. The aperture 55 enables the dot 15 to extend from the supporting member 47 so that contact can be made thereto.

While specific embodiments have been shown and described, it will of course be understood that various modifications may be devised by those skilled in the art which will embody the principles of the invention and found in the true spirit and scope thereof.

What I claim as new and desire to secure by Letters Patent of the United States is:

1. A semiconductor device comprising a germanium wafer having two indium dots fused on opposite faces thereof, a base disk of conductive material, two posts of conductive material mounted on said base disk in insulated relationship to each other and to said base disk, a pair of springs of conductive material, each of said springs mounted on a respective one of said posts and in electrical contact therewith, said springs each having a rounded projecting portion extending toward the other spring, a generally U-shaped supporting member of conductive material and having longitudinal V-shaped grooves in the legs thereof, said wafer of semiconductor material being positioned between the legs of said supporting member and retained therein by said grooves, said supporting member being positioned between said mounting posts and located on said base disk so that said dots are contacted by said projections of said springs, said supporting member being in electrical contact with said base disk, means extending through said base disk and insulated therefrom to make electrical contact with said mounting posts thereby to provide electrical connections to said dots through said posts and said springs, means making electrical contact with said base disk, thereby to make electrical contact with said wafer through said supporting member, and a cap positioned over said base disk and enclosing said wafer, said enclosure being hermetically sealed.

2. A semiconductor device comprising a base member, a pair of electrically-conductive spring members fixedly mounted on said base member and each having a projection extending toward the other, a generally U-shaped supporting member, a wafer of semiconductor material having emitter and collector contacts thereon and positioned within said U-shaped member, said U-shaped member being attached to said base member in a position such that said projections on said spring members contact said emitter and collector contacts, means for making electrical connection to said wafer of semiconductor material and means for making separate contact to each of said spring members.

3. A semiconductor device comprising a base member, a pair of electrically-conductive spring members fixedly mounted on said base member and each having a rounded projection extending toward the other, a piece of semiconductor material having base, emitter and collector electrodes, two of said electrodes extending from the surface of said bodies of semiconductor material, means for supporting said piece of semiconductor material between said spring members in a position so that said two of said electrodes are contacted by said projections on said spring members, means for making electrical connection to the third of said electrodes, and means for making electrical connection to said spring members, thereby to provide emitter, base, and collector connections.

4. A semiconductor device comprising a base member, a generally U-shaped supporting member, a piece of semiconductor material having emitter, base and collector electrodes, positioned within said U-shaped member, means for retaining said piece of semiconductor material wihin said U-shaped member, means for attaching said U-shaped member to said base, means making separate electrical contact to each of said electrodes, and a cap positioned over said wafer of semiconductor material and forming an enclosure therefor with said base member.

5. A semiconductor device comprising a base disk, a pair of spring members fixedly mounted on said base disk and each having a rounded projection extending toward the other, a generally U-shaped member, a piece of semiconductor material having base, emitter and collector electrodes, mounted within said U-shaped member, said U-shaped member being mounted on said base member in a position so that said spring members contact two of said electrodes, means making electrical contact to the third of said electrodes and means making separate electrical contact to each of said spring members thereby to provide leads for each of said base, emitter and collector electrodes.

6. A semiconductor device comprising a body of semiconductor material having a contacting portion extending from a surface thereof, an electrically conductive spring member having a projection thereon, said spring member being mounted in such a position with respect to said body that said projection makes slidable contact with said contacting portion, means for making electrical connections to said body and means for making separate contact to said spring member.

7. A semiconductor device comprising a base member, an electrically conductive spring member mounted on said base member and having a projection thereon, a wafer of semiconductor material having a contact projecting from a surface thereof, said wafer being attached to said base member in such a position that said projection makes slidable contact with said projecting contact, means for making electrical connections to said wafer of semiconductive material and means for making separate contact to said spring member.

8. A semiconductor device comprising a base member, a pair of electrically conductive spring members mounted on said base member and each having a projection thereon, a body of semiconductor material having a pair of projecting contacts thereon and supported on said base member in a position such that each of said projections on said spring members makes contact with respective ones of said contacts, means for making electrical connections to said spring members and said body.

9. A semiconductor device comprising a base member, a pair of electrically conductive spring members mounted on said base member and each having a projection extended toward the other, a body of semiconductor material having the projecting emitter contact of one face of said body and a projecting collector contact on the opposite face of said body, said body being supported on said base member in a position such that said projections on said spring members contact said emitter and collector contacts, means for making electrical contact to said members and said wafer.

10. A semiconductor device comprising a base member, a pair of electrically conductive spring members mounted on said base member and each having a projection extended toward the other, a wafer of semiconductor material having an emitter dot extending from one face of said body and a collector dot extending from the opposite face of said wafer, said wafer being supported on said base member in a position such that each said projection on said spring members contacts respective dots, means for making electrical connections to said members and said wafer.

11. A semiconductor device comprising a base member, an electrically conductive resilient member mounted on said base member and having a projection thereon, a body of semiconductor material having a contact projecting from a surface thereof attached to said base member in such a position that said projection makes slidable contact with said projecting contact, means for making electrical connection to said wafer of semiconductor material and means for making separate contact to said resilient member.

12. A semiconductor device comprising a base member, an electrically conductive member having a tapered contacting surface and mounted on said base member, a wafer of semiconductor material having a projecting contact thereon, means for attaching said wafer to said base member in such a position that said projection makes slidable contact with said tapered surface, means for making electrical connections to said wafer and said conductive member.

13. A semiconductor device comprising a base member, a pair of electrical conductive members having opposed surfaces tapered toward one another and mounted on said base member, a wafer of semiconductor material having a pair of elevated contacts thereon and supported on said base member in a position such that said elevated contacts slidably engage said conductive members, means for making electrical contact to said conductive members and said wafer.

14. A semiconductor device comprising a base member, a pair of conductive members having opposed surfaces tapered toward one another, a wafer of germanium semiconductive material having a pair of indium contacts on opposed surfaces thereof, said wafer being supported on said base member in a position such that each of said contacts makes slidable contact with respective ones of the tapered surfaces of said conductive members, means for making electrical connections to said tapered members and said wafer.

15. A semiconductor device comprising a base member, a generally U-shaped member having longitudinal V-shaped grooves in the legs thereof, a wafer of semiconductor material having emitter base and collector electrodes, said wafer of semiconductor material being positioned between the legs of said supporting member and retained therein by said grooves, means for attaching said U-shaped member to said base, means for making electrical contact to each of said electrodes.

References Cited in the file of this patent

UNITED STATES PATENTS

| | | |
|---|---|---|
| 1,901,893 | Brodie | Mar. 21, 1933 |
| 2,385,666 | Watrobski | Sept. 25, 1945 |
| 2,644,852 | Dunlap | July 7, 1953 |
| 2,691,750 | Shive | Oct. 12, 1954 |
| 2,696,574 | Rich | Dec. 7, 1954 |
| 2,696,575 | Fogg | Dec. 7, 1954 |
| 2,731,704 | Spanos | Jan. 24, 1956 |
| 2,779,903 | Geppert | Jan. 24, 1957 |
| 2,799,814 | Schwartz et al. | July 16, 1957 |

Notice of Adverse Decision in Interference

In Interference No. 90,542 involving Patent No. 2,882,462, C. H. Zierdt, Jr., Semiconductor device, final judgment adverse to the patentee was rendered Mar. 9, 1962, as to claims 6 through 11.

[*Official Gazette May 15, 1962.*]